United States Patent [19]

Snyder et al.

[11] Patent Number: 4,904,933
[45] Date of Patent: Feb. 27, 1990

[54] INTEGRATED CIRCUIT PROBE STATION

[75] Inventors: Delmer E. Snyder, Hillsboro; Cornelis T. Veenendaal, Cornelius; Theodore G. Creedon, Lake Oswego, all of Oreg.

[73] Assignee: Tektronix, Inc., Beaverton, Oreg.

[21] Appl. No.: 905,359

[22] Filed: Sep. 8, 1986

[51] Int. Cl.$^4$ .......................... G01R 1/02; G01R 1/04
[52] U.S. Cl. ............................ 324/158 F; 324/158 P; 318/626
[58] Field of Search ............... 318/601, 568, 603, 626, 318/640, 685; 324/73 PC, 158 F, 158 P, 73 R, 73 AT; 364/180, 181, 182, 160, 167, 474, 513; 901/3, 4, 5, 11, 24, 40, 44; 269/21, 71, 73; 33/573

[56] References Cited

U.S. PATENT DOCUMENTS

| | | | |
|---|---|---|---|
| 3,094,212 | 6/1963 | Moore et al. | 324/73 AT |
| 3,446,065 | 5/1969 | Wiesler et al. | 73/105 |
| 3,743,904 | 7/1973 | Wiesler et al. | 318/162 |
| 3,835,750 | 9/1974 | Dunne | 901/13 |
| 3,958,740 | 5/1976 | Dixon | 901/24 |
| 3,970,830 | 7/1976 | White et al. | 364/181 |
| 3,996,517 | 12/1976 | Fergason et al. | 324/158 F |
| 4,066,943 | 1/1978 | Roch | 318/468 |
| 4,201,939 | 5/1980 | Lee et al. | 324/158 P |
| 4,266,191 | 5/1981 | Spano et al. | 324/158 F |
| 4,500,836 | 2/1985 | Standacher | 324/73 AT |
| 4,590,422 | 5/1986 | Milligon | 324/158 F |
| 4,604,560 | 8/1986 | Inagski et al. | 318/626 |
| 4,611,156 | 9/1986 | Feichtinger | 318/632 |

FOREIGN PATENT DOCUMENTS 0155742  9/1982  Japan .............................. 324/158 F

OTHER PUBLICATIONS

"Probe Tester for Beam-Lead Devices", by Egan et al., West. Elect. Tech. Dig. #21, 1/71, pp.9-10.
"Self-Measurement of Probe Deflection in a Semiconductor Test System", by Byrnes et al., IBM Tech., Dig., vol. 20, #1, 6/77, pp. 166-7.
"Mechanical Evaluation Machine", by De Groodt et al., IBM Tech. Disc., vol. 13, #8, 1/71, pp. 2298-9.

Primary Examiner—Reinhard J. Eisenzopf
Assistant Examiner—W. Burns
Attorney, Agent, or Firm—John D. Winkelman; John Smith-Hill

[57] ABSTRACT

An integrated circuit probe station comprises a table having a substantially planar upper surface, an IC probe positioned over the table in spaced relationship with the upper surface of the table, a chuck carrier, and a chuck. The chuck carrier has a substantially planar lower surface that is positioned in confronting relationship with the upper surface of the table, and a film of viscous material is interposed between the upper surface of the table and the lower surface of the chuck carrier, whereby the chuck carrier may be moved manually relative to the table in horizontal directions while resting on the table. The chuck is carried on the chuck carrier and is movable vertically relative to the chuck carrier. A mechanical prime mover is effective between the chuck carrier and the chuck for bringing about vertical movement of the chuck relative to the chuck carrier.

12 Claims, 1 Drawing Sheet

INTEGRATED CIRCUIT PROBE STATION

This invention relates to an integrated circuit probe station.

BACKGROUND OF THE INVENTION

A conventional integrated circuit probe station designed for engineering use, e.g., device characterization, as opposed to testing of integrated circuit devices on a production basis, comprises a stationary table on which an integrated circuit chip is positioned and a probe that is movable relative to the table for bringing contact elements of the probe into electrically-conductive contact with the contact pads of the chip. The probe may be a ceramic probe of the kind described in U.S. patent application Ser. No. 672,846 filed Nov. 16, 1984. In two practical implementations of a probe station employing ceramic probes of this kind, several probes are mounted on a support structure and are movable relative to each other along the X and Y (horizontal) axes to position their respective contact elements in a pattern corresponding to the pattern of the contact pads of the chip under test, and are movable relative to each other along the Z (vertical) axis to position the contact elements in a common plane. When the probes have been properly positioned on the support structure, the support structure is, in one implementation, moved horizontally, e.g., using two-axis micrometer screws, in order to align the contact elements of the probes with the contact pads of the chip under test. In the other implementation, the probe support structure remains stationary and the chip under test is moved in the horizontal direction on a grease plate. In each case, the support structure is then lowered in order to establish physical contact between the contact elements of the probes and the contact pads of the chip. This technique has proved troublesome because the support structure for the probes is difficult to machine accurately, and therefore it is difficult to achieve precise coplanarity of the contact elements of the probes, and moreover the support structure is heavy and bulky and therefore it is difficult to move the support structure precisely in the vertical direction. Because of the first factor, one or more of the contact elements of the probes may not touch the contact pads of the chip under test with sufficient force to establish electrical contact, or may not touch the contact pads at all. If the operator attempts to cause the support structure to move farther in the vertical direction, so as to achieve the desired contact with all contact elements, the second factor limits the precision with which the support structure can be moved, with the result that one or more of the ceramic probes may be deflected to an excessive extent due to contact force between the contact elements of the probe(s) and the contact pads of the chip, and be broken. Moreover, the nature of the support structure is such that upon movement of the support structure in the vertical direction, the coplanarity of the contact elements may be disturbed.

The Electroglas Model 1034X autoprober has table defining a horizontal surface over which a probe is mounted so that it remains stationary in use. A wafer chuck is moved over the table using two-axis stepping motors to bring the contact pads of a chip on the wafer chuck into position underneath the contact elements of the probe. When the wafer chuck is properly positioned in the horizontal direction, a Z-axis stepping motor is used to raise the chip and establish physical contact between the contact pads of the chip and the contact elements of the probe. Initial positioning of the wafer chuck is achieved manually, by use of a joystick that is coupled to X and Y axis pulse generators for generating pulses to drive X and Y axis stepping motors. After initial positioning has been achieved, the chuck is advanced to successive die sites automatically, without operator intervention.

SUMMARY OF THE INVENTION

A preferred embodiment of the present invention is an integrated circuit probe station that comprises a table having a substantially planar upper surface, an IC probe positioned over the table in spaced relationship with the upper surface of the table, a chuck carrier, and a chuck. The chuck carrier has a substantially planar lower surface that is positioned in confronting relationship with the upper surface of the table, and a film of viscous material is interposed between the upper surface of the table and the lower surface of the chuck carrier, whereby the chuck carrier may be moved manually relative to the table in horizontal directions while resting on the table. The chuck is carried on the chuck carrier and is movable vertically relative to the chuck carrier. A mechanical prime mover is effective between the chuck carrier and the chuck for bringing about vertical movement of the chuck relative to the chuck carrier.

The viscous material provides tactile feedback when the operator grasps the chuck in order to move it horizontally, and therefore the operator is able to control horizontal movement of the chuck with a high degree of precision. Accordingly, the probe station's performance with respect to resolution and repeatability in the horizontal direction is superior to that provided by existing probe stations that employ electromechanical methods for control of horizontal movement. By providing that the mechanical prime mover is effective between the chuck carrier and the chuck, the problems associated with vertical movement of the probe support structure are avoided.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
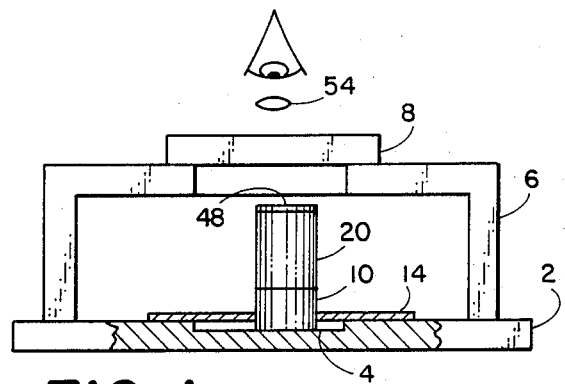
FIG. 1 is a front elevation view, partly in section, of a probe station embodying the present invention.

The probe station illustrated in FIG. 1 comprises a table 2 having a finely machined upper surface 4. In use of the probe station, the table is positioned so that the surface 4 is horizontal. A bridge structure 6 is fitted to the table and supports a probe 8 at a height that is fixed relative to the surface 4. The probe 8 is not specifically illustrated, but it may be a ceramic probe of the kind mentioned above or a polyimide probe of the kind described in U.S. patent application Ser. No. 812,145 filed Dec. 23, 1985 or U.S. patent application Ser. No. 904,600 filed Sept. 5, 1986. If a ceramic probe is employed, the bridge structure may incorporate an XYZ manipulator to enable multiple probes to be positioned relative to each other; if a polyimide probe is employed, the bridge structure may be designed to prevent movement of the probe relative to the table. The bridge structure may be designed to accept interchangeably a polyimide probe and ceramic probes (with XYZ manipulator).

A chuck carrier 10 rests on the surface 4. The chuck carrier has a lower surface 12 (FIG. 2) that is finely ground, and a film of grease is interposed between the surfaces 4 and 12. Movement of the chuck carrier over the surface 4 is resisted substantially only by the viscous damping force due to the grease film. Thus, the chuck carrier can be readily moved in the X and Y (horizontal) directions by manual application of force, and upon removal of manual force the viscous damping force causes the movement to stop substantially instantaneously. The tactile feedback provided to the operator by the viscous damping force through the chuck carrier enables the chuck carrier to be brought to any position on the surface 4 (within the limits imposed by the size and shape of the chuck carrier itself) with a high degree of precision. A series of plates 14 (of which only one is shown) are fitted over the chuck carrier and move with the chuck carrier, so as to keep dust and other contaminants away from the surface 4 and the grease film and preserve the tactile feedback provided by the grease.

A chuck 20 is carried by the chuck carrier 10 and moves in the X and Y directions with the chuck carrier. The chuck carrier incorporates a stepping motor 22 having two stator windings which receive electrical pulses from a controller 60 over a cable 24. The motor responds to each pulse by driving a screw 26 through a predetermined angle. The screw 26 is in threaded engagement with a nut 42 which is held captive in the chuck 20. Guides (not shown) allow linear movement of the chuck carrier relative to the chuck carrier in directions parallel to the central axis of the screw 26 but prevent rotation of the chuck relative to the chuck carrier. Therefore, when the screw 26 is rotated by the motor 22, the chuck is raised or lowered relative to the chuck carrier. The motor 22 and the screw 26 are selected so that for each pulse provided by the controller 60, the chuck is raised (or lowered) a distance of about 0.013 mm. A limit switch 28 is mounted on the chuck carrier and is engaged by the chuck when it moves downwards to a limit position. The limit switch is connected to the controller by way of the cable 24.

The chuck 20 has an upper wafer-receiving surface 44 that is grooved, and the grooves communicate with a passage 46 which is connected to a vacuum pump. Therefore, when a wafer 48 (FIG. 1) including chips that are to be probed is placed on the wafer-receiving surface 44 and the vacuum pump is energized, vacuum is communicated to the grooves and the wafer is secured firmly to the surface 44. Additional passageways 52 are formed just beneath the surface 44 and are connected to a supply of tempering fluid that is circulated through the passageways 52 for controlling the temperature of the wafer 48.

The probe station also incorporates a microscope 54, shown only diagrammatically, through which the user of the probe station may observe the contact elements of the probe and the contact pads of the integrated circuit chips of the wafer held by the chuck.

The controller 60 incorporates a memory and has five distinct operating states. When the controller is in the HOME state, it applies pulses to lower the chuck until it engages the limit switch, and then raises the chuck slightly. The chuck is then in the "home" position. The amount by which the chuck is raised in order to attain the home position is defined by data stored in the controller's memory. When the chuck has been placed in the home position, the chuck carrier may be moved in the X and Y directions so as to position the contact pads of a chip that is to be probed substantially directly beneath the contact elements of the probe, as detected by observation through the microscope 54. The controller is then placed in the MANUAL state. In the MANUAL state, a knob 62 may be used to adjust the height of the chuck 20. Thus, the knob 62 is connected to a pulse generator 64 which generates a predetermined number of pulses for each revolution of the knob. These pulses are fed to the motor 22 and cause the motor to rotate the screw 26 in one sense or other, depending on the sense in which the knob 62 is being rotated, so as to raise or lower the chuck 20. When the controller is placed in the MANUAL state, the operator rotates the knob 62 in the direction to raise the chuck from the home position until the contact pads of the chip under test enter into electrical contact with the contact elements of the probe. This event is visually discernible through the microscope 54, or it may be detected by electronic instrumentation (not shown) connected to the probe. When the chuck is in this position, the operator may make fine adjustments to the position of the chuck carrier, to ensure that the contact pads of the chip are properly contacted by the contact elements of the probe. Also, the operator places the controller in the STORE state, in which it stores in its memory a digital word representative of the number of pulses that were generated by the pulse generator 64 in order to raise the chuck from the home position to the position in which the contact pads just touch the contact elements. The operator may then place the controller in the PROBE state. If, when the controller is in the MANUAL state, the operator inadvertently rotates the knob 62 in the direction to lower the chuck, and the chuck engages the limit switch 28, the controller 60 responds by entering the HOME state, so that the knob 62 is disabled and the chuck is raised to the home position.

Figure 2:
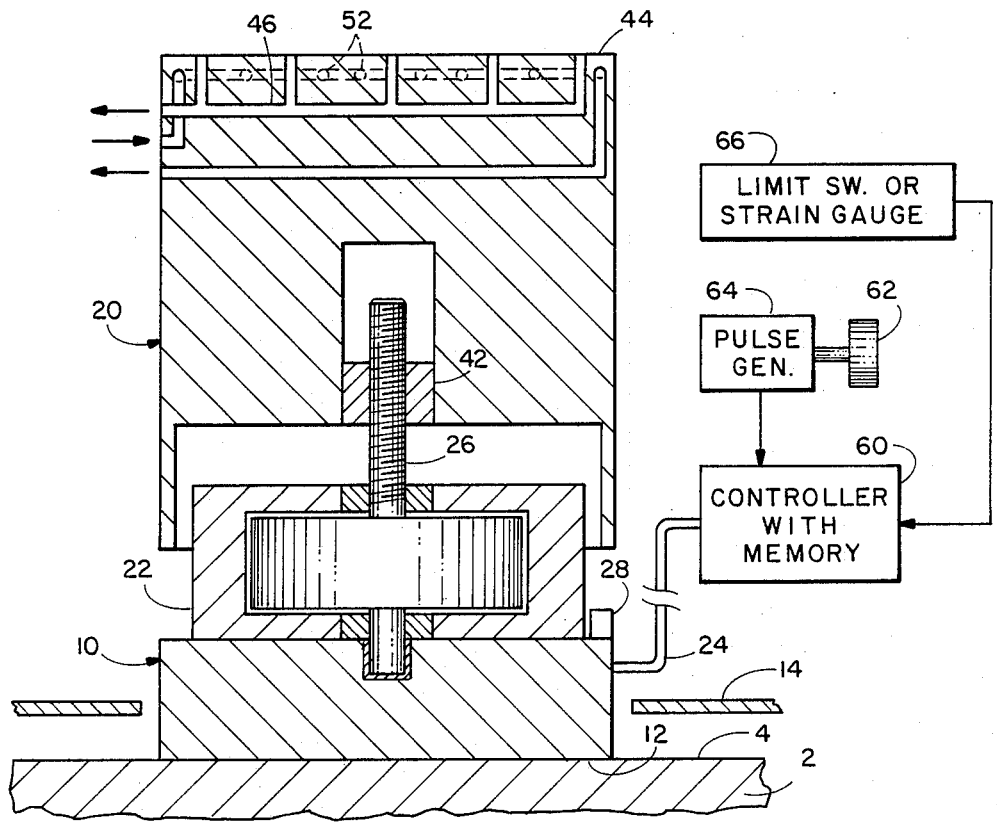
FIG. 2 is an enlarged sectional view of a detail of FIG. 1.

In the PROBE state, the controller applies additional pulses to the motor 22 in order to raise the chuck sufficiently to cause a firm contact between the contact elements of the probe and the contact pads of the chip under test, without damaging either the probe or the wafer. In the case of a ceramic probe, the probe may incorporate a strain gauge for detecting deflection of the probe, and in the PROBE state the controller continues to supply pulses to the motor until the degree of deflection detected by the strain gauge indicates that the desired contact force has been achieved. In the case of a polyimide probe, in which the contact elements are carried on a film of polyimide and contact force is provided by a resiliently-deformable back-up member, a limit switch may be used to define the maximum desired deflection of the polyimide film and provide a signal to the controller 60 when the maximum desired deflection is attained. The signal provided by the limit switch disables the controller from supplying additional pulses to the motor. The block 66 in FIG. 2 illustrates schematically such a strain gauge or limit switch associated with the probe. Alternatively, or in addition, in the case of a polyimide probe the number of additional pulses required to provide adequate contact force may be determined from the mechanical properties of the back-up member and stored in the memory of the controller.

When a particular chip has been probed and necessary measurements have been made, the operator causes the controller to enter the HOME state, and the controller returns the chuck 40 to the home position by lowering the chuck until it engages the limit switch 28 and then raising the chuck slightly. When the chuck is in the home position, the operator adjusts the horizontal position of the chuck carrier so as to place the contact pads of another chip beneath the contact elements of the probe, and then places the controller in the JUST TOUCHING state. In the JUST TOUCHING state, the controller recalls the number that was stored in the STORE mode and supplies the motor 22 with that number of pulses, and accordingly the chuck is raised from the home position to the position in which the contact pads of the second chip just touch the contact elements of the probe. The horizontal position of the chuck can be adjusted at this point to ensure that the contact pads of the chip are properly aligned with the contact elements of the probe, and when alignment has been achieved the operator places the controller in the PROBE state.

It will be seen from the foregoing that the illustrated probe station is semi-automatic, in that once the number of pulses required in order to raise the chuck from the home position to the just touching position has been stored, Z-axis movement is carried out automatically in response to commands given to the controller by the operator and the risk of damaging the probe or the chip is reduced. Direct manual control of horizontal movement of the chuck ensures that the chuck can be brought quickly and precisely to any desired horizontal position. When the controller is in the HOME, JUST TOUCHING or PROBE state, the rate at which pulses are applied to the stepping motor is adjusted so that the motor accelerates smoothly from rest and decelerates smoothly, so that jarring of the chip and the probe are avoided.

It will be appreciated that the present invention is not restricted to the particular embodiment that has been described and illustrated, and that variations may be made therein without departing from the scope of the invention as defined in the appended claims and equivalents thereof. For example, although the invention has been described with reference to probing of chips in wafer form, i.e. prior to dicing, by suitable design of the vacuum chuck the invention may also be applied to probing of chips in die form or to the probing of other solid state electronic devices such as hybrid integrated circuits.

We claim:

1. A probe station comprising:
    a table having a substantially planar upper surface,
    support means for supporting a probe a fixed distance above said upper surface,
    a chuck carrier having a substantially planar lower surface, the chuck carrier resting on the table with said lower surface of the carrier confronting said upper surface of the table,
    a film of viscous bearing material interposed between the confronting surfaces to permit relative movement between the chuck carrier and the table in directions parallel to said upper surface through the application of manual force directly to the chuck carrier, said movement being substantially without resistance other than the viscous damping force produced by the viscous bearing material,
    a chuck mounted on the chuck carrier by means permitting relative movement between the chuck and carrier in opposite directions substantially perpendicular to said upper surface of the table, and
    a mechanical prime mover effective between the carrier and the chuck for bringing about movement between them in said opposite directions.

2. A probe station according to claim 1, wherein the mechanical prime-mover comprises an electrical stepping motor mounted in the chuck carrier and having a threaded output shaft extending substantially perpendicular to said upper surface, and the chuck includes a nut that is held captive against rotation relative to the chuck carrier and against linear movement relative to the chuck and is in threaded engagement with the output shaft of the motor, whereby rotation of the output shaft brings about linear movement of the chuck relative to the chuck carrier in a direction substantially perpendicular to said upper surface.

3. A probe station according to claim 2, comprising a controller that is connected to the stepping motor for supplying electrical pulses to the stepping motor at a controlled rate for causing the motor to rotate the output shaft, the controller having a manual operating state, in which the rate of supply of pulses is controlled manually, and at least one automatic operating state, in which the rate of supply of pulses is controlled automatically by the controller.

4. A probe station according to claim 3, wherein the chuck carrier comprises a limit switch that is engaged by the chuck when the chuck is moved in the direction towards said upper surface, said limit switch being connected to the controller for interrupting the supply of pulses to the motor in the event that the limit switch is engaged by the chuck.

5. A probe station according to claim 3, wherein the controller has a plurality of automatic operating states and is switchable manually between automatic operating states.

6. A probe station according to claim 5, wherein the controller can be placed in a first automatic state in which the stepping motor moves the chuck to a home position, when the chuck is in the home position the controller can be placed in a second automatic state in which the stepping motor moves the chuck a first predetermined amount from the home position in the direction away from said upper surface and brings the chuck to a halt in a second position, and when the chuck is in the second position the controller can be placed in a third automatic state in which the stepping motor moves the chuck an additional amount in the direction away from said upper surface and brings the chuck to a halt.

7. A probe station according to claim 6, comprising disabling means for limiting the amount by which the chuck can be moved in the third automatic state.

8. A probe station according to claim 6, wherein the controller includes a memory for storing data defining the amount by which the chuck is moved when in the third automatic state.

9. A probe station according to claim 6, wherein the controller includes a memory for storing data generated in the manual operating state and defining the amount by which the chuck is moved when in the second automatic state.

10. A probe station according to claim 6, wherein the chuck carrier comprises a limit switch that is engaged by the chuck when the chuck is moved in the direction towards said upper surface, said limit switch being connected to the controller for interrupting the supply of pulses to the motor in the event that the limit switch is engaged by the chuck, and the controller includes a memory for storing data defining the amount by which the chuck must be moved in the direction away from said upper surface from the position in which it engages the limit switch in order to reach the home position.

11. A probe station according to claim 2, comprising:
a controller that is connected to the stepping motor for energizing the stepping motor to cause the stepping motor to rotate the output shaft and thereby bring about movement of the chuck relative to the chuck carrier selectively in the direction towards said upper surface or in the direction away from said upper surface, and a limit switch that is engaged when the chuck is moved in the direction towards said upper surface, said limit switch being connected to the controller for preventing further movement of the chuck carrier in the direction towards said upper surface, and wherein the controller responds to engagement of the limit switch by the chuck by moving the chuck in the direction away from said upper surface by a predetermined amount to a home position.

12. A probe station according to claim 11, wherein the controller has a plurality of automatic operating states and is switchable manually between automatic operating states, the controller having a first automatic state in which the chuck is moved by a first predetermined amount from the home position in the direction away from said upper surface and is brought to a halt, a second automatic state in which the chuck is moved an additional amount in the direction away from said upper surface and is brought to a halt, and a third automatic state in which the chuck is moved in the direction towards said upper surface until it engages the limit switch.

* * * * *